(12) United States Patent
Kuo et al.

(10) Patent No.: US 11,978,715 B2
(45) Date of Patent: May 7, 2024

(54) STRUCTURE AND FORMATION METHOD OF CHIP PACKAGE WITH PROTECTIVE LID

(71) Applicant: Taiwan Semiconductor Manufacturing Company, Ltd., Hsinchu (TW)

(72) Inventors: Meng-Tsung Kuo, Hsinchu County (TW); Hui-Chang Yu, Hsinchu County (TW); Chih-Kung Huang, Hsinchu (TW); Wei-Teng Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 109 days.

(21) Appl. No.: 17/324,372

(22) Filed: May 19, 2021

(65) Prior Publication Data
US 2022/0278069 A1 Sep. 1, 2022

Related U.S. Application Data

(60) Provisional application No. 63/154,025, filed on Feb. 26, 2021.

(51) Int. Cl.
*H01L 23/00* (2006.01)
*H01L 21/48* (2006.01)
(Continued)

(52) U.S. Cl.
CPC .......... *H01L 24/33* (2013.01); *H01L 21/4817* (2013.01); *H01L 23/10* (2013.01); *H01L 23/3675* (2013.01); *H01L 24/29* (2013.01); *H01L 24/30* (2013.01); *H01L 24/32* (2013.01); *H01L 24/83* (2013.01); *H01L 25/0655* (2013.01); *H01L 24/73* (2013.01); *H01L 2224/2979* (2013.01); *H01L 2224/29791* (2013.01); *H01L 2224/29824* (2013.01); *H01L 2224/29839* (2013.01); *H01L 2224/29844* (2013.01); *H01L 2224/29847* (2013.01);
(Continued)

(58) Field of Classification Search
CPC ........................ H01L 2224/8485–8489; H01L 2224/8385–83885; H01L 2924/161–16798
See application file for complete search history.

(56) References Cited

U.S. PATENT DOCUMENTS 8,993,380 B2 3/2015 Hou et al.
9,000,584 B2 4/2015 Lin et al.
(Continued)

*Primary Examiner* — Amar Movva
(74) *Attorney, Agent, or Firm* — McClure, Qualey & Rodack, LLP

(57) ABSTRACT

A package structure and a formation method of a package structure are provided. The method includes disposing a chip structure over a substrate and forming a first adhesive element directly on the chip structure. The first adhesive element has a first thermal conductivity. The method also includes forming a second adhesive element directly on the chip structure. The second adhesive element has a second thermal conductivity, and the second thermal conductivity is greater than the first thermal conductivity. The method further includes attaching a protective lid to the chip structure through the first adhesive element and the second adhesive element.

20 Claims, 17 Drawing Sheets

(51) Int. Cl.
*H01L 23/10* (2006.01)
*H01L 23/367* (2006.01)
*H01L 25/065* (2023.01)

(52) U.S. Cl.
CPC ............... *H01L 2224/29886* (2013.01); *H01L 2224/29893* (2013.01); *H01L 2224/3015* (2013.01); *H01L 2224/3016* (2013.01); *H01L 2224/30179* (2013.01); *H01L 2224/30505* (2013.01); *H01L 2224/32145* (2013.01); *H01L 2224/32155* (2013.01); *H01L 2224/32245* (2013.01); *H01L 2224/3315* (2013.01); *H01L 2224/3316* (2013.01); *H01L 2224/33179* (2013.01); *H01L 2224/33181* (2013.01); *H01L 2224/73204* (2013.01); *H01L 2224/73253* (2013.01); *H01L 2224/83201* (2013.01)

(56) References Cited

U.S. PATENT DOCUMENTS

| | | | |
|---|---|---|---|
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,299,649 B2 | 3/2016 | Chiu et al. | |
| 9,368,460 B2 * | 6/2016 | Yu | H01L 23/5389 |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2006/0175710 A1 * | 8/2006 | Xie | H01L 21/565 |
| | | | 257/E21.503 |
| 2014/0264930 A1 | 9/2014 | Yu | |
| 2015/0155221 A1 | 6/2015 | Chen | |
| 2020/0006181 A1 | 1/2020 | Chen | |
| 2020/0161275 A1 | 5/2020 | Lin | |
| 2021/0098332 A1 | 4/2021 | Wang et al. | |
| 2021/0366861 A1 * | 11/2021 | Chen | H01L 23/053 |

* cited by examiner

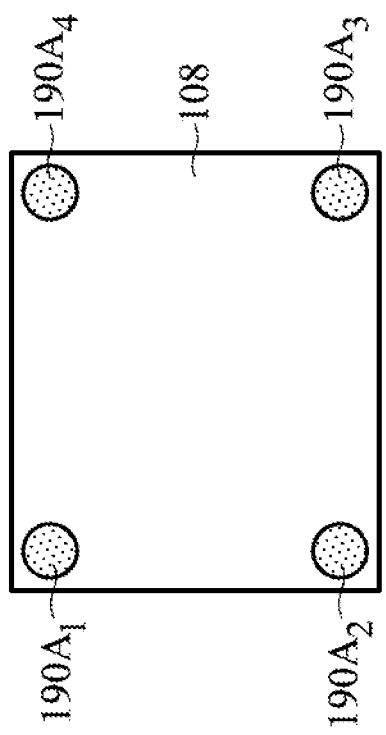
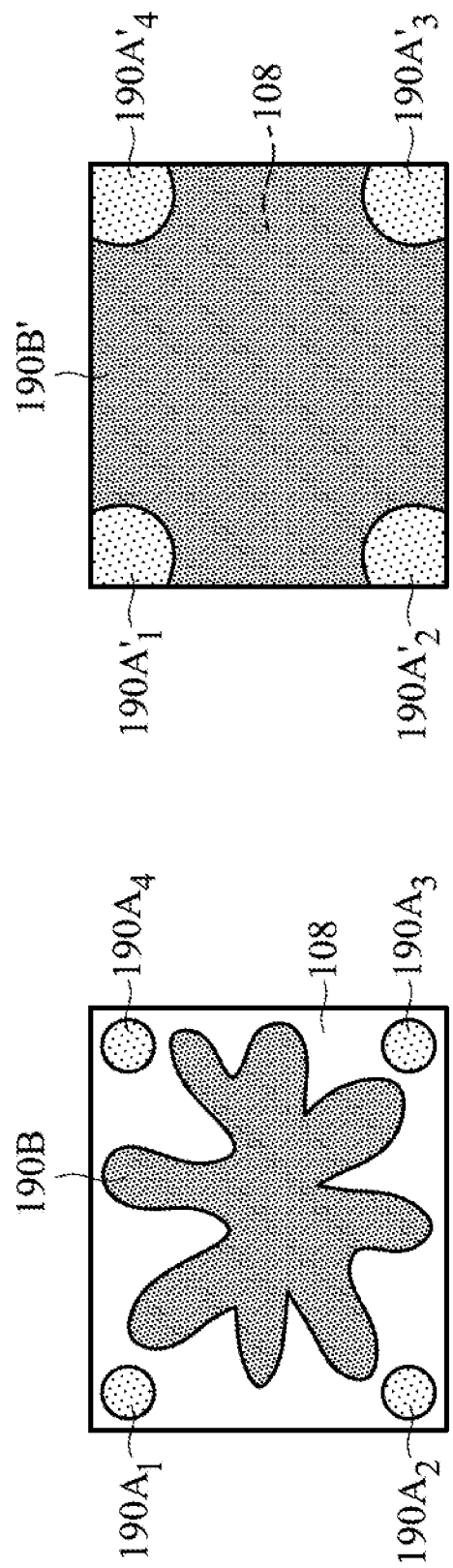

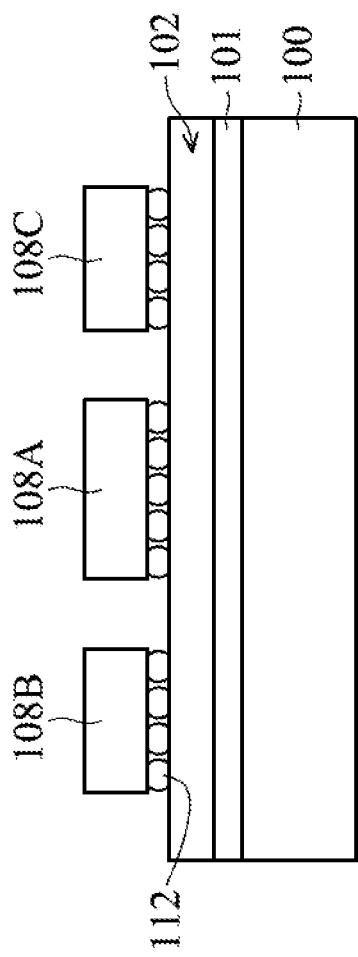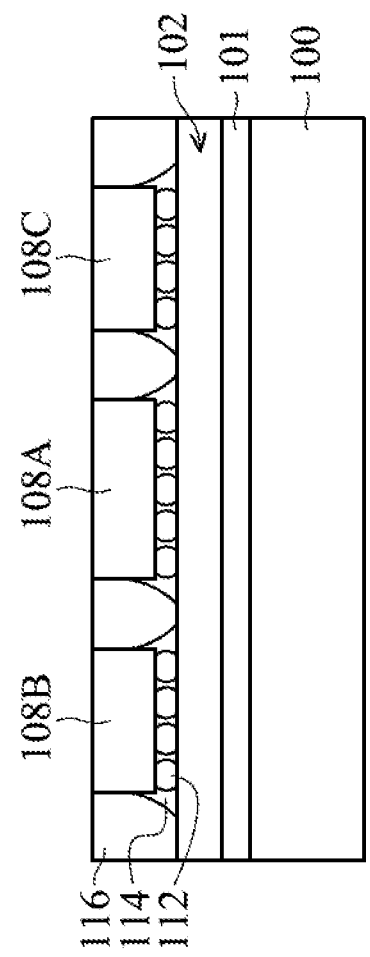

STRUCTURE AND FORMATION METHOD OF CHIP PACKAGE WITH PROTECTIVE LID

PRIORITY CLAIM AND CROSS-REFERENCE

This application claims the benefit of U.S. Provisional Application No. 63/154,025, filed on Feb. 26, 2021, the entirety of which is incorporated by reference herein.

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature sizes (i.e., the smallest component that can be created using a fabrication process) have decreased. This scaling-down process generally provides benefits by increasing production efficiency and lowering associated costs.

A chip package not only provides protection for semiconductor devices from environmental contaminants, but also provides a connection interface for the semiconductor devices packaged therein. Smaller package structures, which take up less space or are lower in height, have been developed to package the semiconductor devices.

New packaging technologies have been developed to further improve the density and functionality of semiconductor dies. These relatively new types of packaging technologies for semiconductor dies face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 5A-5C are plan views of various stages of a process for forming a portion of a package structure, in accordance with some embodiments.

FIGS. 7A-7G are cross-sectional views of various stages of a process for forming a portion of a package structure, in accordance with some embodiments.

DETAILED DESCRIPTION

Figure 1A:
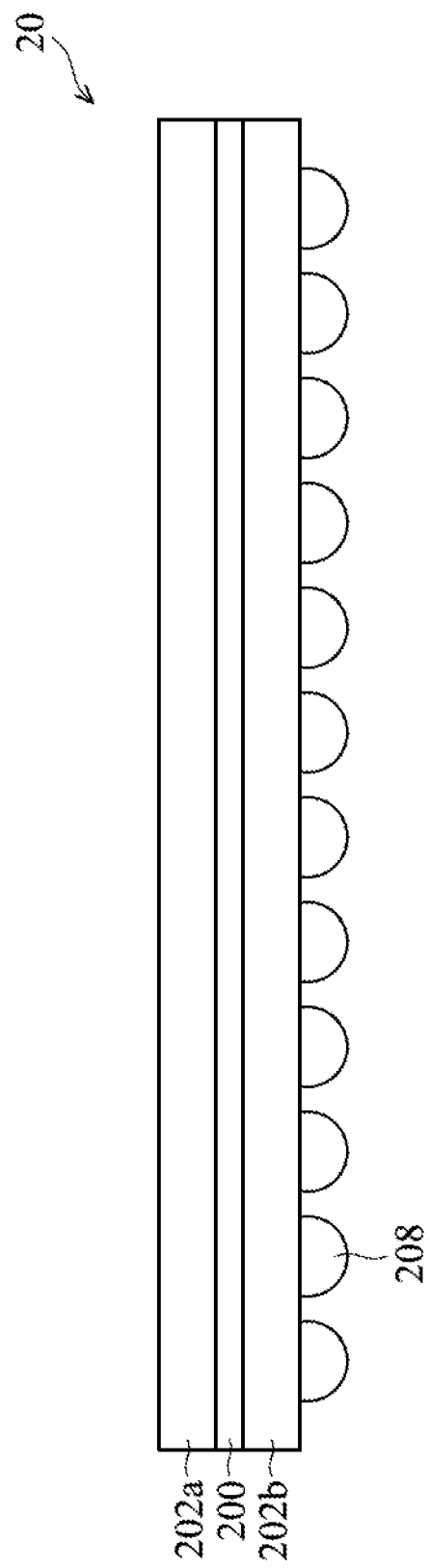
FIGS. 1A-1D are cross-sectional views of various stages of a process for forming a portion of a package structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher of what is specified, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10 degrees. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

Some embodiments of the disclosure are described. Additional operations can be provided before, during, and/or after the stages described in these embodiments. Some of the stages that are described can be replaced or eliminated for different embodiments. Additional features can be added to the semiconductor device structure and/or the package structure. Some of the features described below can be replaced or eliminated for different embodiments. Although some embodiments are discussed with operations performed in a particular order, these operations may be performed in another logical order.

Embodiments of the disclosure may relate to package structures such as three-dimensional (3D) packaging or 3D-IC devices. Embodiments of the disclosure form a package structure including a substrate that carries one or more dies or packages and a protective element (such as a protective lid) aside the dies or packages. The protective element may also function as a warpage-control element and/or heat dissipation element.

In some embodiments, the protective element is attached to the one or more dies or packages through two or more adhesive elements. One or some of the adhesive elements is/are thermally conductive. The thermal conductive adhesive element(s) may enhance the heat dissipation of the one or more dies or packages. Another adhesive element may help to reduce the risk of cracking of the package structure. Due to the hybrid adhesive elements, the heat dissipation and reliability of the package structure may be improved at the same time.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1D are cross-sectional views of various stages of a process for forming a portion of a package structure, in accordance with some embodiments. As shown in FIG. 1A, a substrate 20 (such as a circuit substrate or a package substrate) is received or provided. In some embodiments, the substrate 20 includes a core portion 200. The substrate 20 may further includes multiple insulating layers 202a and 202b and multiple conductive features (not shown in FIG. 1A). The conductive features may include conductive lines, conductive vias, and conductive pads. The conductive features may be used to route electrical signals between opposite sides of the substrate 20. The insulating layers 202a and 202b may be made of or include one or more polymer materials. The conductive features may be made of or include copper, aluminum, cobalt, tungsten, gold, one or more other suitable materials, or a combination thereof.

The core portion 200 may include organic materials such as materials that can be easily laminated. In some embodiments, the core portion 200 may include a single-sided or double-sided copper clad laminate, epoxy, resin, glass fiber, molding compound, plastic (such as polyvinylchloride (PVC), acrylonitrile, butadiene and styrene (ABS), polypropylene (PP), polyethylene (PE), polystyrene (PS), polymethyl methacrylate (PMMA), polyethylene terephthalate (PET), polycarbonates (PC), polyphenylene sulfide (PPS)), one or more other suitable elements, or a combination thereof.

Conductive vias may extend through the core portion 200 to provide electrical connections between elements disposed on either side of the core portion 200. In some embodiments, the substrate 20 further includes bonding structures 208. In some embodiments, the bonding structures 208 are solder bumps. In some embodiments, the bonding structures 208 are made of tin-containing solder materials. The tin-containing solder materials may further include copper, silver, gold, aluminum, lead, one or more other suitable materials, or a combination thereof. In some other embodiments, the bonding structures 208 are lead-free. In some embodiments, the bonding structures 208 are used for bonding with another element such as a printed circuit board.

Many variations and/or modifications can be made to embodiments of the disclosure. In some other embodiments, the substrate 20 includes a ceramic material, a semiconductor material, a polymer material, one or more other suitable materials, or a combination thereof.

Figure 1B:
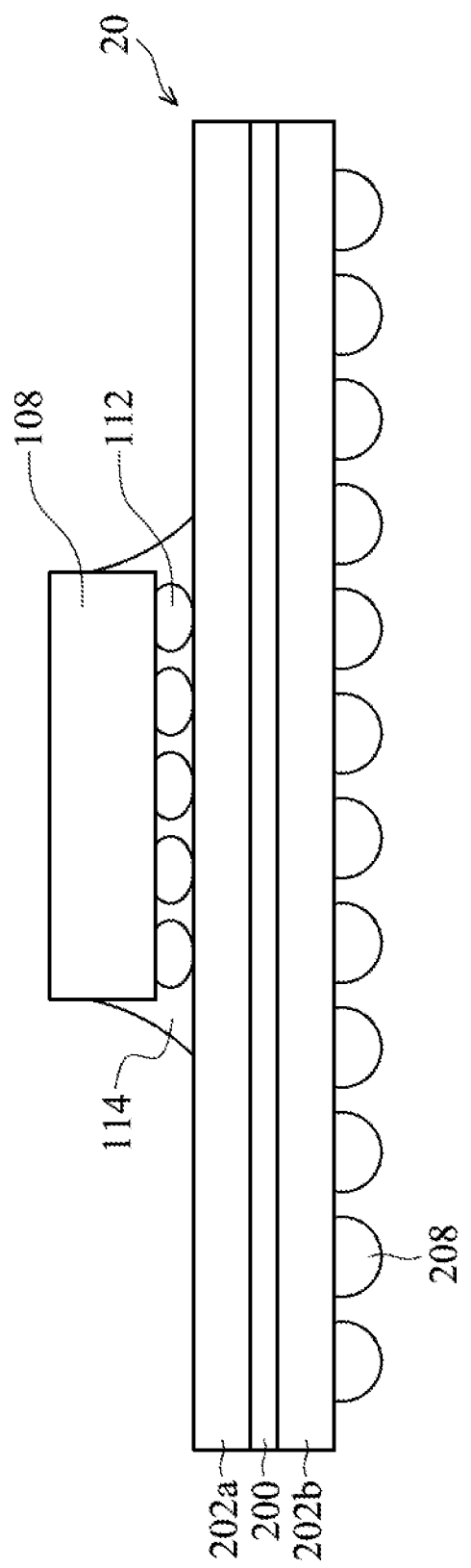

As shown in FIG. 1B, a chip structure (or a chip-containing structure) 108 is disposed over the substrate 20, in accordance with some embodiments. The chip structure 108 may be a single semiconductor die, system-on-integrated-chips (SoIC), and/or a package including one or more semiconductor dies that are encapsulated or protected. For the system-on-integrated-chips, multiple semiconductor dies may be stacked and bonded together to form electrical connections between these semiconductor dies. These semiconductor dies may be bonded to each other through hybrid bonding that may include dielectric-to-dielectric bonding and metal-to-metal bonding.

In some embodiments, the chip structure 108 is bonded to the substrate 20 through conductive connectors 112. In some embodiments, the chip structure 108 includes conductive pillars (or conductive pads) with solder elements formed thereon. Other solder elements may also be formed on the conductive pads of the substrate 20. The chip structure 108 is picked up and placed onto the substrate 20. In some embodiments, the solder elements of the chip structure 108 and/or the solder elements on the conductive pads of the substrate 20 are reflowed together. As a result, the reflowed solder elements form the conductive connectors 112.

In some embodiments, the conductive connectors 112 are made of tin-containing solder materials. The tin-containing solder materials may further include copper, silver, gold, aluminum, lead, one or more other suitable materials, or a combination thereof. In some embodiments, the conductive connectors 112 are lead-free.

Afterwards, an underfill material is dispensed onto the substrate 20 along one side of the chip structure 108, in accordance with some embodiments. The underfill material may be made of or include a polymer material, such as an epoxy-based resin with fillers dispersed therein. The fillers may include fibers (such as silica fibers and/or carbon-containing fibers), particles (such as silica particles and/or carbon-containing particles), or a combination thereof. The underfill material may be drawn into the space between the chip structure 108 and the substrate 20 to surround the conductive connectors 112 by the capillary force. In some embodiments, the underfill material is thermally heated and cured to form an underfill structure 114. As a result, the underfill structure 114 that surrounds the conductive connectors 112 is formed, as shown in FIG. 1B.

Figure 1C:
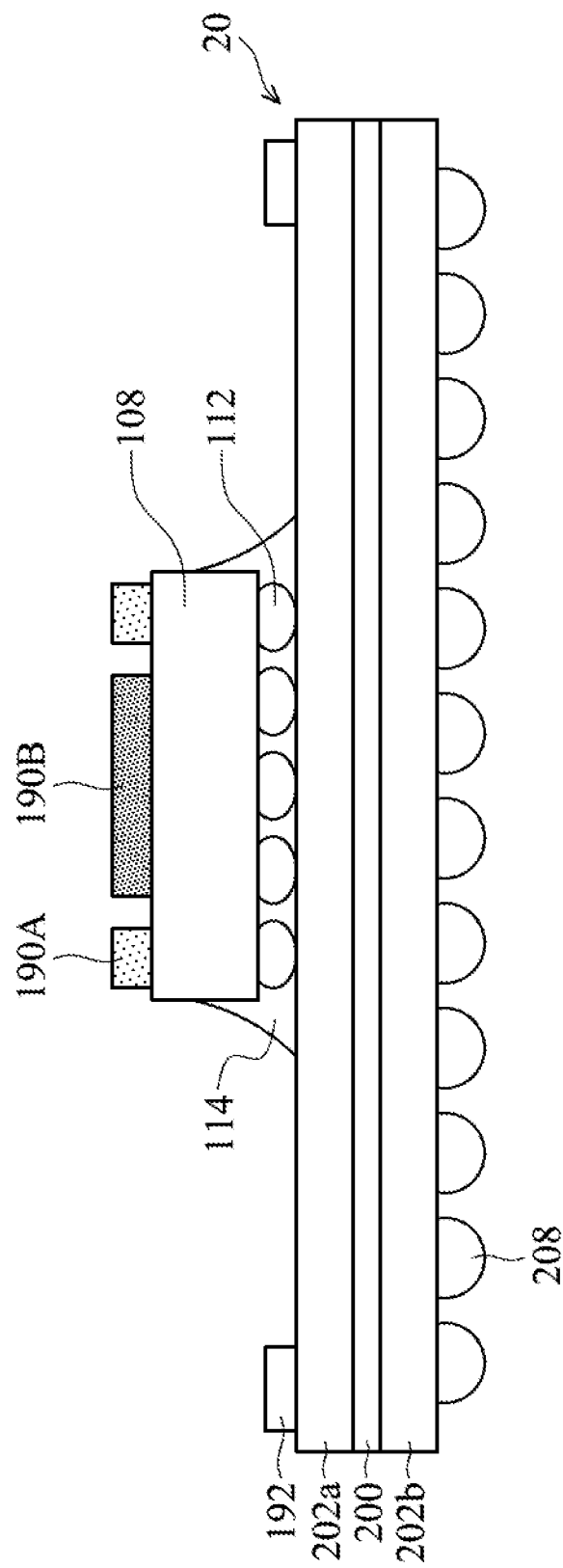

As shown in FIG. 1C, a first adhesive element 190A and a second adhesive element 190B are formed over the chip structure 108, in accordance with some embodiments. In some embodiments, the first adhesive element 190A and the second adhesive element 190B are formed directly on the chip structure 108. In some embodiments, a third adhesive element 192 is formed over the substrate 20. In some embodiments, the first adhesive element 190A, the second adhesive element 190B, and the third adhesive element 192 are adhesive glues.

Figure 2B:
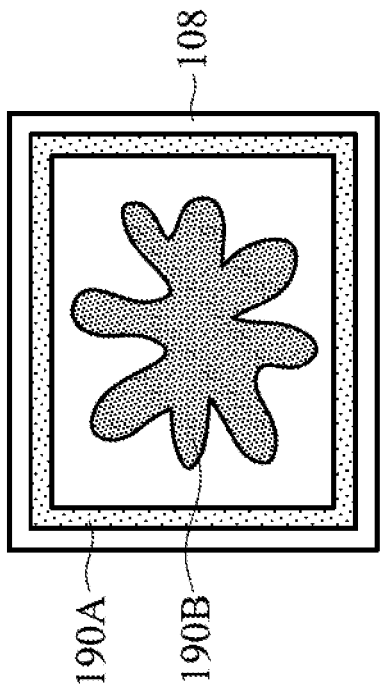
FIGS. 2A-2C are plan views of various stages of a process for forming a portion of a package structure, in accordance with some embodiments.
Figure 2A:
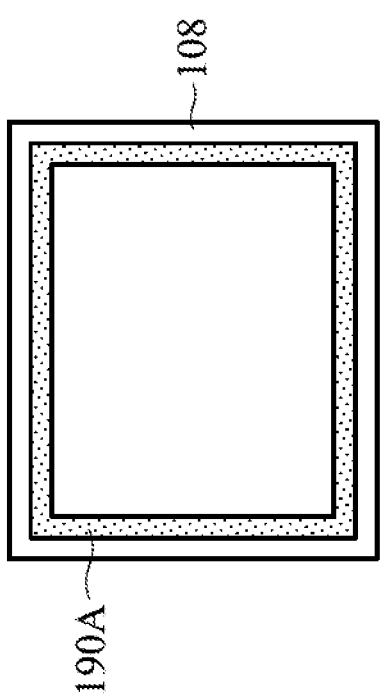
Figure 2C:
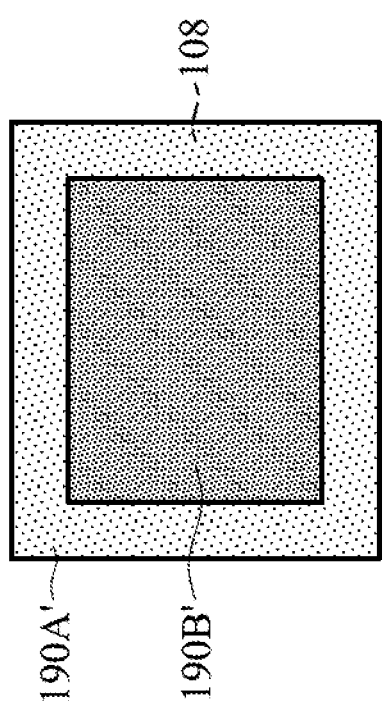

FIGS. 2A-2C are plan views of various stages of a process for forming a portion of a package structure, in accordance with some embodiments. In some embodiments, FIG. 2A shows the plan view of the chip structure 108 after the first adhesive element 190A is formed. In some embodiments, the first adhesive element 190A is a first adhesive glue that is dispensed along the periphery of the top surface of the chip structure 108, as shown in FIG. 2A.

As shown in FIG. 2B, the second adhesive element 190B is then formed to cover the center portion of the chip structure 108, in accordance with some embodiments. In some embodiments, the second adhesive element 190B is a second adhesive glue that is dispensed within the region laterally surrounded by the first adhesive element 190A. In some embodiments, FIG. 2B shows the top view of a portion of the structure shown in FIG. 1C. In some embodiments, FIG. 2B shows the top view of the chip structure 108 and the distribution of the first adhesive element 190A and the second adhesive element 190B. The top view of the second adhesive element 190B may have a variety of shapes. For example, the top view of the second adhesive element 190B may have a radial pattern, as shown in FIG. 2B.

In some embodiments, the second adhesive element 190B is formed to be closer to the center of the top surface of the chip structure 108 than the first adhesive element 190A, as shown in FIG. 2B. In some embodiments, the first adhesive element 190A is formed to cover one or more corner portions of the chip structure 108. For example, the first adhesive element 190A covers four corner portions of the chip structure 108, as shown in FIG. 2B. In some embodiments, the second adhesive element 190B covers the center of the chip structure 108. In some embodiments, the second adhesive element 190B covers the hot zone area of the chip structure 108. The hot zone area is the region of the chip structure 108 with a higher temperature during the operation of the chip structure 108. In some embodiments, the hot zone area of the chip structure 108 includes the center of the top surface of the chip structure 108.

In some embodiments, the first adhesive element 190A and the second adhesive element 190B are formed to be separated from each other, as shown in FIG. 2B. However, embodiments of the disclosure are not limited thereto. In some embodiments, the first adhesive element 190A and the second adhesive element 190B are adhesive glues that are flowable. In some other embodiments, the first adhesive element 190A and the second adhesive element 190B that are dispensed are in direct contact with each other.

In the embodiments illustrated in FIGS. 2A and 2B, the first adhesive element 190A is formed before the second adhesive element 190B. However, embodiments of the disclosure are not limited thereto. In some other embodiments, the first adhesive element 190A is formed after the second adhesive element 190B.

In some embodiments, the first adhesive element 190A and the second adhesive element 190B are made of different materials. The first adhesive element 190A has a first thermal conductivity, and the second adhesive element 190B has a second thermal conductivity. In some embodiments, the second thermal conductivity is greater than the first thermal conductivity. For example, the first thermal conductivity may be in a range from about 1 W/mK to about 4 W/mK, and the second thermal conductivity may be in a range from about 5 W/mK to about 20 W/mK.

The first adhesive element 190A has a first Young's modulus, and the second adhesive element 190B has a second Young's modulus. In some embodiments, the first Young's modulus is greater than the second Young's modulus. For example, the first Young's modulus may be in a range from about 100 MPa to about 1000 MPa, and the second Young's modulus may be in a range from about 20 KPa to about 20 MPa. The first adhesive element 190A that has the greater Young's modulus may provide good adhesive between the chip structure 108 and a subsequently disposed protective element. Since the adhesion between the chip structure 108 and the protective element is improved, the reliability of the package structure is improved.

The second adhesive element 190B may be used to enhance the heat dissipation of the chip structure 108. The first adhesive element 190A may help to reduce the risk of cracking of the package structure. Due to the hybrid adhesive elements (i.e., the first adhesive element 190A and the second adhesive element 190B), the heat dissipation and reliability of the package structure may be improved at the same time.

In some embodiments, the first adhesive element 190A and the second adhesive element 190B include a polymer material with fillers dispersed therein. The polymer material may include an epoxy-based glue and/or a silicone-based glue. The fillers may include silver fillers, silver-containing fillers, alumina fillers, alumina-containing fillers, copper fillers, copper-containing fillers, gold fillers, gold-containing fillers, graphene fillers, aluminum fillers, aluminum-containing fillers, graphene-containing fillers, one or more other suitable fillers, or a combination thereof. The fillers may be particles, fibers, or a combination thereof.

The first adhesive element 190A may have a first concentration of fillers, and the second adhesive element 190B may have a second concentration of fillers. In some embodiments, the second concentration of fillers of the second adhesive element 190B is higher than the first concentration of fillers of the first adhesive element 190A. For example, the fillers in the first adhesive element 190A and the second adhesive element 190B are alumina fillers such as alumina particles. The second adhesive element 190B has a higher concentration of alumina fillers than that of the first adhesive element 190A.

In some embodiments, the averages sizes of the fillers in the first adhesive element 190A and the second adhesive element 190B are different from each other. The first adhesive element 190A may contain first fillers with a first average size (such as a first average particle size), and the second adhesive element 190B may contain second fillers with a second average size (such as a second average particle size). In some embodiments, the second average size is greater than the first average size. For example, the first fillers in the first adhesive element 190A are alumina fillers with a first average size of about 10 µm to about 20 µm, and the second fillers in the second adhesive element 190B are alumina fillers with a second average size of about 30 µm.

In some embodiments, the fillers in the first adhesive element 190A and the second adhesive element 190B are made of different materials. In some embodiments, the fillers in the second adhesive element 190B have a greater thermal conductivity than that of the fillers in the first adhesive element 190A. For example, the fillers in the second adhesive element 190B may include silver fillers and/or silver-containing fillers, and the fillers in the first adhesive element 190A may include alumina fillers and/or alumina-containing fillers.

Figure 1D:
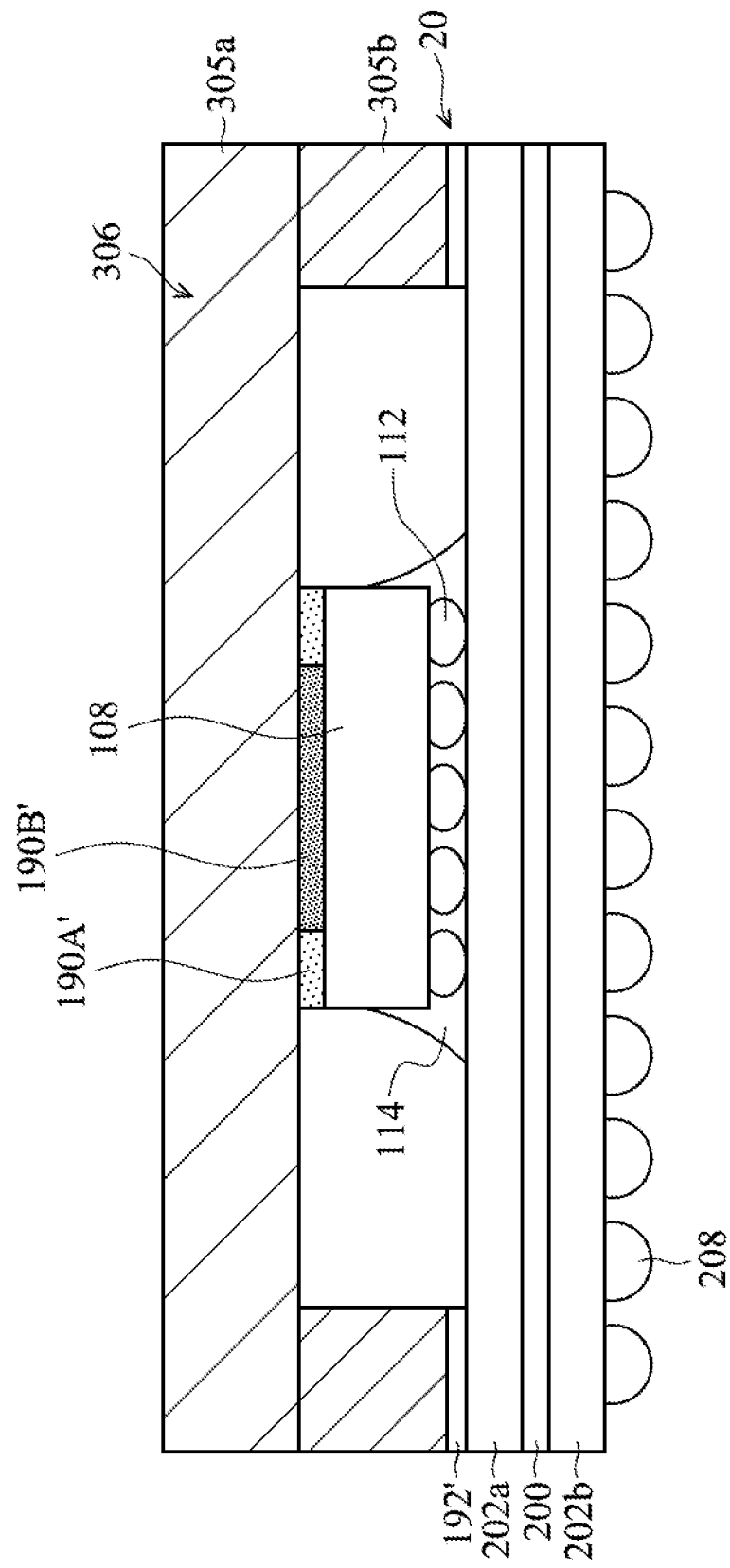

Afterwards, as shown in FIG. 1D, a protective element 306 is disposed over the chip structure 108 and the substrate 20, in accordance with some embodiments. In some embodiments, FIG. 2C shows the top view of the chip structure 108 in FIG. 1D. In FIG. 2C, for the sake of simplicity and clarity, the protective element 306 is not shown.

The protective element 306 may function as a warpage-control element and/or a heat dissipation element. In some embodiments, the protective element 306 is a protective lid. The protective element 306 may include an upper plate 305*a* and a support structure 305*b*. In some embodiments, the protective element 306 and the substrate 20 together surround an enclosed (or sealed) space where the chip structure 108 is positioned.

Many variations and/or modifications can be made to embodiments of the disclosure. In some other embodiments, the space surrounded by the protective element 306 and the substrate 20 is not an enclosed space. For example, one or more openings may be formed in the protective element 306. The openings may help to release thermal stress of the protective element 306 and/or the substrate 20.

In some embodiments, the upper plate 305*a* and the support structure 305*b* are formed in one piece. In some other embodiments, the upper plate 305*a* and the support structure 305*b* are two separate pieces that are bonded together through a conductive glue therebetween. In some embodiments, the protective element 306 is made of a thermally conductive material such as a metal material or a semiconductor material. The thermally conductive material may include steel, aluminum, gold, copper, silicon, one or more other suitable materials, or a combination thereof.

In some embodiments, the protective element 306 is attached to chip structure 108 through first extended adhesive element 190A' and second extended adhesive element 190B', as shown in FIG. 1D. In some embodiments, the protective element 306 is attached to the substrate 20 through third extended adhesive element 192', as shown in FIG. 1D.

In some embodiments, the first adhesive element 190A and the second adhesive element 190B are squeezed by the upper plate 305*a* of the protective element 306. The first adhesive element 190A and the second adhesive element 190B are thus extended to form the first extended adhesive element 190A' and the second extended adhesive element 190B', as shown in FIGS. 1D and 2C. The first extended adhesive element 190A' and the second extended adhesive element 190B' become thinner and occupy larger area of the chip structure 108 than the first adhesive element 190A and the second adhesive element 190B. The first extended adhesive element 190A' and second extended adhesive element 190B' are spread between the protective element 306 and the chip structure 108 while the protective element 136 is attached to the chip structure 108. In some embodiments, the first extended adhesive element 190A' laterally and continuously surrounds the second extended adhesive element 190B'.

Similarly, in some embodiments, the third adhesive element 192 is squeezed by the support structure 305*b* of the protective element 306. The third adhesive element 192 is thus extended to form the third extended adhesive element 192', as shown in FIG. 1D. The third extended adhesive element 192' is thinner and occupies larger area of the substrate 20 than the third adhesive element 192. The third extended adhesive element 192' is spread between the protective element 306 and the substrate 20.

In some embodiments, the outer edge of the third extended adhesive element 192' is substantially aligned with the sidewall of the substrate 20 and/or the outer sidewall of the support structure 305*b* of the protective element 306, as shown in FIG. 1D. In some embodiments, the edge of the first extended adhesive element 190A' is substantially aligned with the sidewall of the chip structure 108, as shown in FIG. 1D.

In some embodiments, the first adhesive element 190A and the second adhesive element 190B are separated from each other before the protective element 306 is attached to the chip structure 108, as shown in FIGS. 1C and 2B. After the protective element 306 is disposed, the first adhesive element 190A and the second adhesive element 190B extend towards each other to form the first extended adhesive element 190A' and the second extended adhesive element 190B'. In some embodiments, the first extended adhesive element 190A' and the second extended adhesive element 190B' are in direct contact with each other, as shown in FIGS. 1D and 2C.

However, embodiments of the disclosure are not limited thereto. Many variations and/or modifications can be made to embodiments of the disclosure. In some other embodiments, the first extended adhesive element 190A' and the second extended adhesive element 190B' remain separated from each other.

In some embodiments, a thermal operation is performed to the first extended adhesive element 190A' and the second extended adhesive element 190B' after the protective element 306 is attached to the chip structure 108, so as to enhance the adhesion between the protective element 306 and the chip structure 108. The operation temperature may be in a range from about 120 degrees C. to about 180 degrees C. The operation time may be in a range from about 200 seconds to about 2 hours. In some other embodiments, another thermal operation is performed to the first adhesive element 190A and the second adhesive element 190B before the protective element 306 is attached to the chip structure 108.

Many variations and/or modifications can be made to embodiments of the disclosure. In some other embodiments, one or more of the first adhesive element 190A, the second adhesive element 190B, and the third adhesive element 192 are adhesive tapes. In some embodiments, the adhesive tape(s) may not be flowable.

In some embodiments, the bonding structures 208 are formed before the chip structure 108 is bonded to the substrate 20, as shown in FIGS. 1A to 1B. However, embodiments of the disclosure are not limited thereto. In some other embodiments, the bonding structures 208 are formed after the chip structure 108 is bonded to the substrate 20. For example, the bonding structures 208 are formed after the protective element 306 is attached to the chip structure 108.

Figure 3:
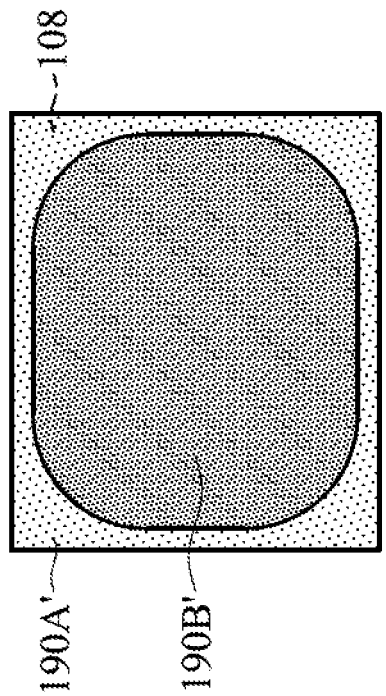
FIG. 3 is a plan view of a portion of a package structure, in accordance with some embodiments.

Many variations and/or modifications can be made to embodiments of the disclosure. FIG. 3 is a plan view of a portion of a package structure, in accordance with some embodiments. In some embodiments, different portions of the first extended adhesive element 190A' have different widths. In some embodiments, the portion of the first extended adhesive element 190A' over the corner portion of the chip structure 108 is wider than the portion of the first extended adhesive element 190A' over the side portion of the chip structure 108, as shown in FIG. 3.

In some embodiments illustrated in FIGS. 2A-2C, the first adhesive element 190A is dispensed or applied over the chip structure 108 before the second adhesive element 190B. However, embodiments of the disclosure are not limited thereto. Many variations and/or modifications can be made to embodiments of the disclosure. In some other embodiments, the second adhesive element 190B is dispensed or applied over the chip structure 108 before the first adhesive element 190A.

Figure 4A:
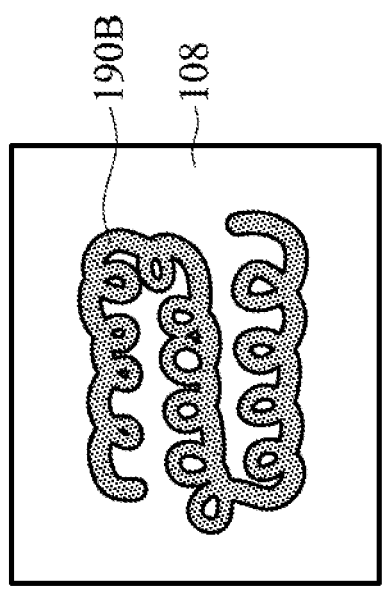
FIGS. 4A-4C are plan views of various stages of a process for forming a portion of a package structure, in accordance with some embodiments.
Figure 4C:
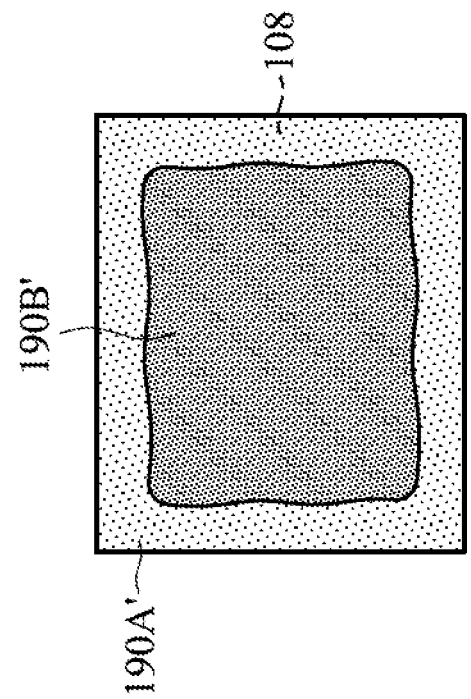
Figure 4B:
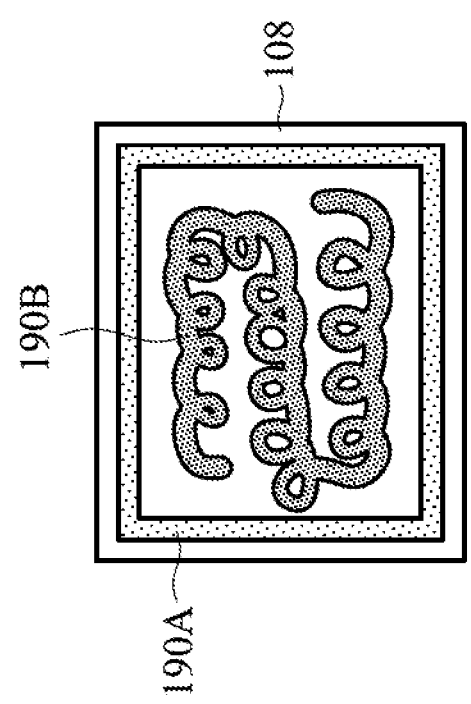

FIGS. 4A-4C are plan views of various stages of a process for forming a portion of a package structure, in accordance with some embodiments. As shown in FIG. 4A, the second adhesive element 190B is dispensed or applied over the chip structure 108 to cover the hot zone area (such as the center area) of the chip structure 108, in accordance with some embodiments. The top view of the second adhesive element 190B may have a variety of shapes. For example, the top view of the second adhesive element 190B may have a spiral pattern, as shown in FIG. 4A.

Afterwards, the first adhesive element 190A is dispensed or applied over the chip structure 108, as shown in FIG. 4B in accordance with some embodiments. In some embodiments, the first adhesive element 190A partially covers the corner portions of the chip structure 108. In some embodiments, the first adhesive element 190A laterally surrounds the second adhesive element 190B. In some embodiments, the first adhesive element 190A laterally and continuously surrounds the second adhesive element 190B.

Afterwards, similar to the embodiments illustrated in FIGS. 2C and 1D, the first adhesive element 190A and the second adhesive element 190B are squeezed by the protective element 306. As a result, the first adhesive element 190A and the second adhesive element 190B are extended to respectively form first extended adhesive element 190A' and second extended adhesive element 190B', as shown in FIG. 4C in accordance with some embodiments.

In some embodiments, the first extended adhesive element 190A' and the second extended adhesive element 190B' become thinner and occupy larger area of the chip structure 108 than the first adhesive element 190A and the second adhesive element 190B. The first extended adhesive element 190A' and second extended adhesive element 190B' are spread between the protective element 306 and the chip structure 108. In some embodiments, the first extended adhesive element 190A' and second extended adhesive element 190B' are in direct contact with each other. In some embodiments, the interface between the first extended adhesive element 190A' and second extended adhesive element 190B' has a tortuous profile, as shown in FIG. 4C.

In some embodiments illustrated in FIG. 2A-2C or 3A-3C, the first adhesive element 190A covers the side portions of the chip structure 108 and laterally surrounds the second adhesive element 190B. However, embodiments of the disclosure are not limited thereto. Many variations and/or modifications can be made to embodiments of the disclosure. In some other embodiments, one or more first adhesive elements are formed to cover the one or more corner portions of the chip structure 108. Parts of the side portions of the chip structure 108 are not covered by the first adhesive element(s).

FIGS. 5A-5C are plan views of various stages of a process for forming a portion of a package structure, in accordance with some embodiments. As shown in FIG. 5A, multiple first adhesive elements $190A_1$, $190A_2$, $190A_3$, and $190A_4$ are dispensed or applied over the chip structure 108, in accordance with some embodiments. The first adhesive elements $190A_1$ to $190A_4$ partially cover the corner portions of the chip structure 108. The material and formation method of the first adhesive elements $190A_1$ to $190A_4$ may be the same as or similar to those of the first adhesive element 190A illustrated in FIG. 1C.

As shown in FIG. 5B, the second adhesive element 190B is dispensed or applied over the chip structure 108 to cover the hot zone area (such as the center area) of the chip structure 108, in accordance with some embodiments. The top view of the second adhesive element 190B may have a variety of shapes. For example, the top view of the second adhesive element 190B may have a radial pattern, as shown in FIG. 5B.

Afterwards, similar to the embodiments illustrated in FIGS. 2C and 1D, the first adhesive elements $190A_1$ to $190A_4$ and the second adhesive element 190B are squeezed by the protective element 306. As a result, the first adhesive elements $190 A_1$ to $190A_4$ and the second adhesive element 190B are extended to respectively form first extended adhesive elements $190A'_1$ to $190A'_4$ and second extended adhesive element 190B', as shown in FIG. 5C in accordance with some embodiments.

In some embodiments, the first extended adhesive elements $190A'_1$ to $190A'_4$ and the second extended adhesive element 190B' become thinner and occupy larger area of the chip structure 108 than the first adhesive elements $190A_1$ to $190A_4$ and the second adhesive element 190B. The first extended adhesive elements $190A'_1$ to $190A'_4$ and second extended adhesive element 190B' are spread between the protective element 306 and the chip structure 108. In some embodiments, each of the first extended adhesive element $190A'_1$ to $190A'_4$ is in direct contact with the second extended adhesive element 190B'. In some embodiments, the first adhesive elements $190A_1$ to $190A_4$ occupied the corner portions of the chip structure 108, as shown in FIG. 5C.

Many variations and/or modifications can be made to embodiments of the disclosure. For example, one of the first adhesive element and the second adhesive element is an adhesive tape.

Figure 6:
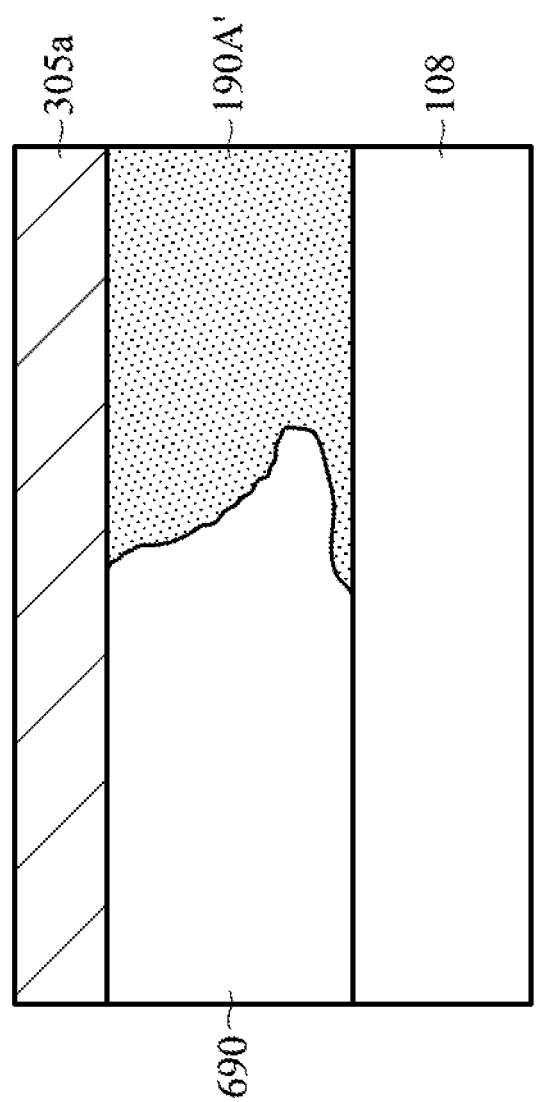
FIG. 6 is a cross-sectional view of a portion of a package structure, in accordance with some embodiments.

FIG. 6 is a cross-sectional view of a portion of a package structure, in accordance with some embodiments. Similar to the embodiments illustrated in FIG. 1D, the upper plate 305a of the protective element is attached to the chip structure 108 through the first extended adhesive element 190A' and a second adhesive element 690, as shown in FIG. 6 in accordance with some embodiments. In some embodiments, the second adhesive element 690 is an adhesive tape. In some embodiments, the adhesive tape is not flowable. In some embodiments, the sidewall of the adhesive tape has a tortuous profile, as shown in FIG. 6. In some embodiments, the second adhesive element 690, as an adhesive tape, may have a curved or square profile. The first extended adhesive element 190A' may extend between the upper plate 305a and the upper sidewall of the second adhesive element 690 and between the chip structure 108 and the lower sidewall of the second adhesive element 690, to enhance the adhesion.

In some embodiments, the second adhesive element 690 is attached to the chip structure 108 before the adhesive glue used for forming the first extended adhesive element 190A' is dispensed or applied on the chip structure 108. In some other embodiments, the second adhesive element 690 is attached to the chip structure 108 after the adhesive glue used for forming the first extended adhesive element 190A' is dispensed or applied on the chip structure 108.

Many variations and/or modifications can be made to embodiments of the disclosure. In some other embodiments, the first extended adhesive element 190A' is replaced with an adhesive tape.

In some embodiments, the protective element 306 is attached to the chip structure 108 that includes a single semiconductor chip. However, embodiments of the disclosure are not limited thereto. Many variations and/or modifications can be made to embodiments of the disclosure. In some other embodiments, the protective element 306 is attached to a chip structure that includes multiple semiconductor chips. In some embodiments, the protective element 306 is attached to a die package that includes one or more semiconductor chips. Due to the hybrid adhesive elements between the protective element 306 and the die package, the heat dissipation and reliability may be improved at the same time.

Figure 7C:
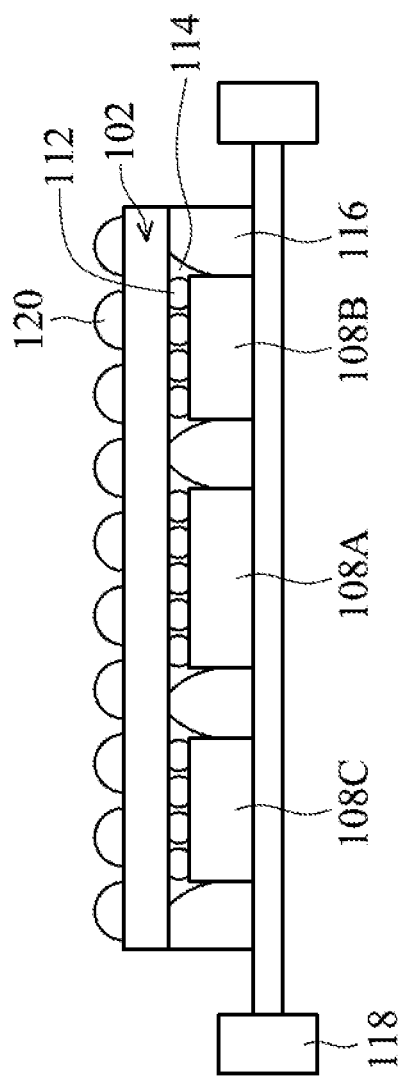

FIGS. 7A-7G are cross-sectional views of various stages of a process for forming a portion of a package structure, in accordance with some embodiments. As shown in FIG. 7A, a carrier substrate 100 is provided or received. The carrier substrate 100 is used as a support substrate during the fabrication process. In some embodiments, the carrier substrate 100 is a temporary support carrier and will be removed later.

The carrier substrate 100 may be made of or include a dielectric material, a semiconductor material, one or more other suitable materials, or a combination thereof. In some embodiments, the carrier substrate 100 is a dielectric substrate, such as a glass wafer. In some other embodiments, the carrier substrate 100 is a semiconductor substrate, such as a silicon wafer. The semiconductor substrate may be made of or include silicon, germanium, silicon germanium, one or more other suitable semiconductor materials, or a combination thereof.

As shown in FIG. 7A, a redistribution structure 102 is formed over the carrier substrate 100, in accordance with some embodiments. The redistribution structure 102 may include a release film 101, multiple insulating layers, and multiple conductive features. The release film 101 and the carrier substrate 100 may together be removed later.

In some embodiments, the insulating layers in the redistribution structure 102 are polymer-containing layers. The insulating layers may be made of or include one or more polymer materials. The polymer material(s) may include polybenzoxazole (PBO), polyimide (PI), epoxy-based resin, one or more other suitable polymer materials, or a combination thereof. In some embodiments, the polymer material is photosensitive. A photolithography process may therefore be used to form openings with desired patterns in the insulating layers. These openings may be used to contain some of the conductive features.

The conductive features in the redistribution structure 102 may include conductive lines, conductive vias, and/or conductive pads. The conductive features may be made of or include copper, cobalt, tin, titanium, gold, platinum, aluminum, tungsten, one or more other suitable materials, or a combination thereof. The conductive features may be formed using an electroplating process, an electroless plating process, one or more other applicable processes, or a combination thereof. The formation of the conductive features may further involve one or more etching processes.

As mentioned above, some of the conductive features in the redistribution structure 102 are conductive vias. In some embodiments, the upper portion of the conductive via is wider than the lower portion of the conductive via.

As shown in FIG. 7A, multiple chip structures (or chip-containing structures) 108A, 108B, and 108C are disposed over the redistribution structure 102, in accordance with some embodiments. In some embodiments, before the chip structures 108A, 108B, and 108C are disposed, a testing operation is performed to the conductive paths of the redistribution structure 102 to ensure the quality and reliability of the redistribution structure 102.

In some embodiments, the chip structures 108A, 108B, and 108C are bonded onto the conductive pads of the redistribution structure 102 through conductive connectors 112. In some embodiments, each of the chip structures 108A, 108B, and 108C includes conductive pillars (or conductive pads) with solder elements formed thereon. Other solder elements may also be formed on the conductive pads of the redistribution structure 102. The chip structures 108A, 108B, and 108C are picked up and placed onto the redistribution structure 102. In some embodiments, the solder elements of the chip structures 108A, 108B, and 108C and/or the solder elements on the conductive pads of the redistribution structure 102 are reflowed together. As a result, the reflowed solder elements form the conductive connectors 112.

In some embodiments, the conductive connectors 112 are made of tin-containing solder materials. The tin-containing solder materials may further include copper, silver, gold, aluminum, lead, one or more other suitable materials, or a combination thereof. In some other embodiments, the conductive connectors 112 are lead-free.

Each of the chip structures 108A, 108B, and 108C may be a single semiconductor die, system-on-integrated-chips (SoIC), and/or a package including one or more semiconductor dies that are encapsulated or protected. For the system-on-integrated-chips, multiple semiconductor dies may be stacked and bonded together to form electrical connections between these semiconductor dies. These semiconductor dies may be bonded to each other through hybrid bonding that may include dielectric-to-dielectric bonding and metal-to-metal bonding.

In some embodiments, the semiconductor die(s) in each of the chip structures 108A, 108B, and 108C is a system-on-chip (SoC) chip that includes multiple functions. In some embodiments, the back sides of the semiconductor dies face upwards with the front sides of the semiconductor dies facing the redistribution structure 102. In some embodiments, some of the semiconductor dies include memory devices such as high bandwidth memory (HBM) devices.

In some other embodiments, the chip structures 108A, 108B, and 108C are packages that include one or more semiconductor dies therein. In some other embodiments, the chip structure 108A is an SoIC die, and the chip structures 108B and 108C include memory devices.

As shown in FIG. 7B, an underfill structure 114 is formed to surround and protect the conductive connectors 112, in accordance with some embodiments. The underfill structure 114 may be made of or include a polymer material, such as an epoxy-based resin with fillers dispersed therein. The fillers may include fibers (such as silica fibers and/or carbon-containing fibers), particles (such as silica particles and/or carbon-containing particles), or a combination thereof.

Afterwards, a protective layer 116 is formed over the redistribution structure 102 to surround and protect the chip structures 108A, 108B, and 108C, as shown in FIG. 7B in accordance with some embodiments. In some embodiments, the protective layer 116 is in direct contact with the redistribution structure 102. In some embodiments, the protective layer 116 is separated from the conductive connectors 112 below the chip structures 108A, 108B, and 108C by the underfill structure 114.

However, embodiments of the disclosure are not limited thereto. Many variations and/or modifications can be made to embodiments of the disclosure. In some other embodiments, the underfill structure 114 is not formed. In these cases, the protective layer 116 may be in direct contact with the conductive connectors 112 below the chip structures 108A, 108B, and 108C.

In some embodiments, the protective layer 116 is made of or includes an insulating material such as a molding material. The molding material may include a polymer material, such as an epoxy-based resin with fillers dispersed therein.

The fillers may include fibers (such as silica fibers and/or carbon-containing fibers), particles (such as silica particles and/or carbon-containing particles), or a combination thereof. In some embodiments, the distribution density of the fillers in the protective layer 116 is greater than the distribution density of the fillers in the underfill structure 114. In some embodiments, the weight percentage of the fillers in the protective layer 116 is greater than the weight percentage of the fillers in the underfill structure 114. The profiles, sizes, and/or materials of the fillers in the protective layer 116 and the underfill structure 114 may be different from each other.

In some embodiments, a molding material (such as a flowable molding material) is introduced or injected to cover the redistribution structure 102 and the chip structures 108A, 108B, and 108C. In some embodiments, a thermal process is then used to cure the flowable molding material and to transform it into the protective layer 116. In some embodiments, a planarization process is performed to the protective layer 116 to improve the flatness of the protective layer 116. For example, the planarization process may include a grinding process, a CMP process, a dry polishing process, one or more other applicable processes, or a combination thereof. In some embodiments, after the planarization process, the surfaces of the chip structures 108A, 108B, and 108C are exposed. In some embodiments, the top surface of the protective layer 116 is substantially level with the surfaces of the chip structures 108A, 108B, and 108C.

Afterwards, the structure shown in FIG. 7B is flipped upside down and attached onto a carrier tape 118, in accordance with some embodiments. Afterwards, the carrier substrate 100 and the release film 101 are removed, as shown in FIG. 7C in accordance with some embodiments. As a result, the surface of the redistribution structure 102 that is originally covered by the carrier substrate 100 is exposed.

Afterwards, conductive connectors 120 are formed over the redistribution structure 102, as shown in FIG. 7C in accordance with some embodiments. In some embodiments, the material of the conductive connectors 120 are the same as or similar to those of the conductive connectors 112. The formation of the conductive connectors 120 may involve applying solder materials and one or more thermal reflow operations. In some embodiments, each of the conductive connectors 120 is larger than each of the conductive connectors 112, as shown in FIG. 7C.

Figure 7D:
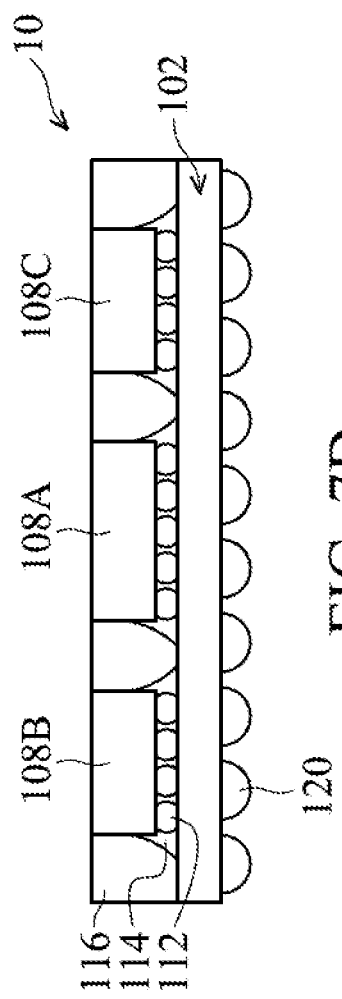

In some embodiments, a sawing process is used to cut through the structure shown in FIG. 7C into multiple separate die packages. After the sawing process, one die package (or a chip-containing structure) 10 is picked from the carrier tape 118 and turned upside down, as shown in FIG. 7D in accordance with some embodiments. The chip structure 108 is to be integrated with other elements to form a larger package structure. The chip structure 108 that includes the chip structures 108A-108C may also be referred to as a "chip structure" or a "chip-containing structure".

However, embodiments of the disclosure are not limited thereto. Many variations and/or modifications can be made to embodiments of the disclosure. In some other embodiments, the sawing process is not performed to separate the structure in FIG. 7C into multiple smaller die packages. The entirety of the package structure may directly be integrated into a large package structure without being sawed.

Figure 7E:
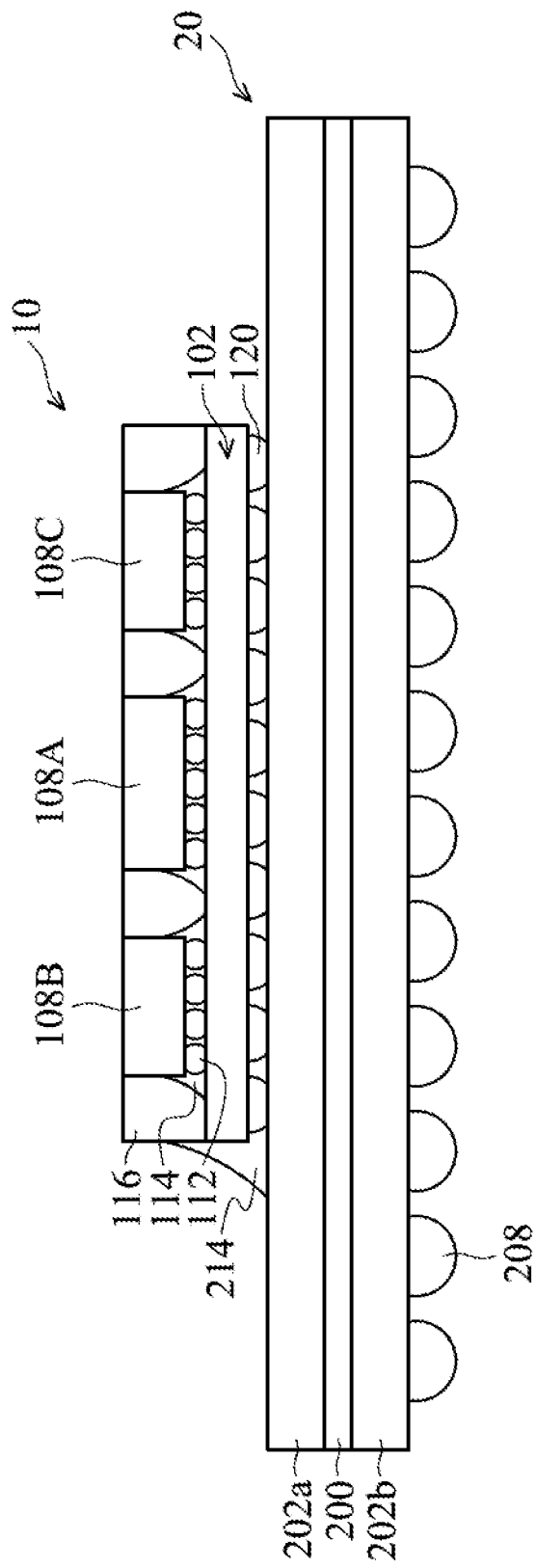

As shown in FIG. 7E, similar to the embodiments illustrated in FIG. 1B, the die package 10 is bonded to the substrate 20, in accordance with some embodiments. In some embodiments, an underfill structure 214 is formed to surround the conductive connectors 120. The material and formation method of the underfill structure 214 may be the same as or similar to those of the underfill structure 114.

Figure 7F:
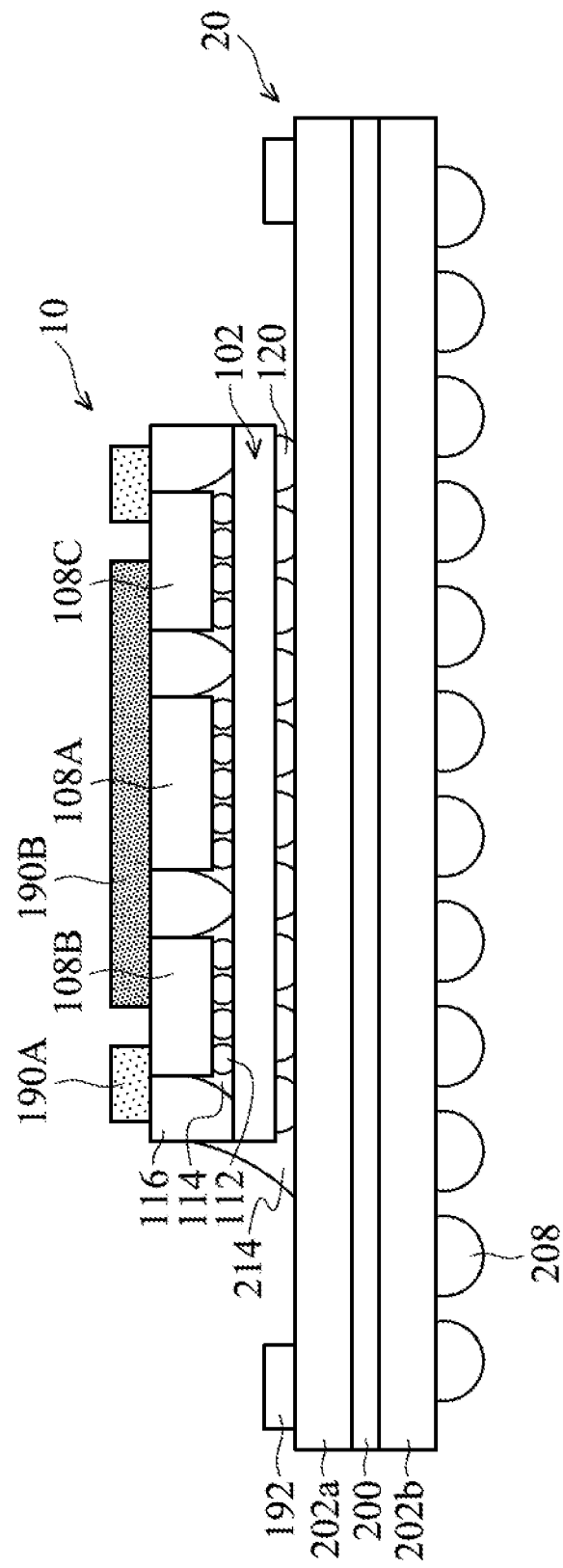

As shown in FIG. 7F, similar to the embodiments mentioned above, the first adhesive element 190A, the second adhesive element 190B, and the third adhesive element 192 are formed, in accordance with some embodiments. The arrangement and/or distribution of the first adhesive element 190A and the second adhesive element 190B may be the same as or similar to those illustrated in FIGS. 2A-2B, 4A-4B, and/or 5A-5B.

Figure 7G:
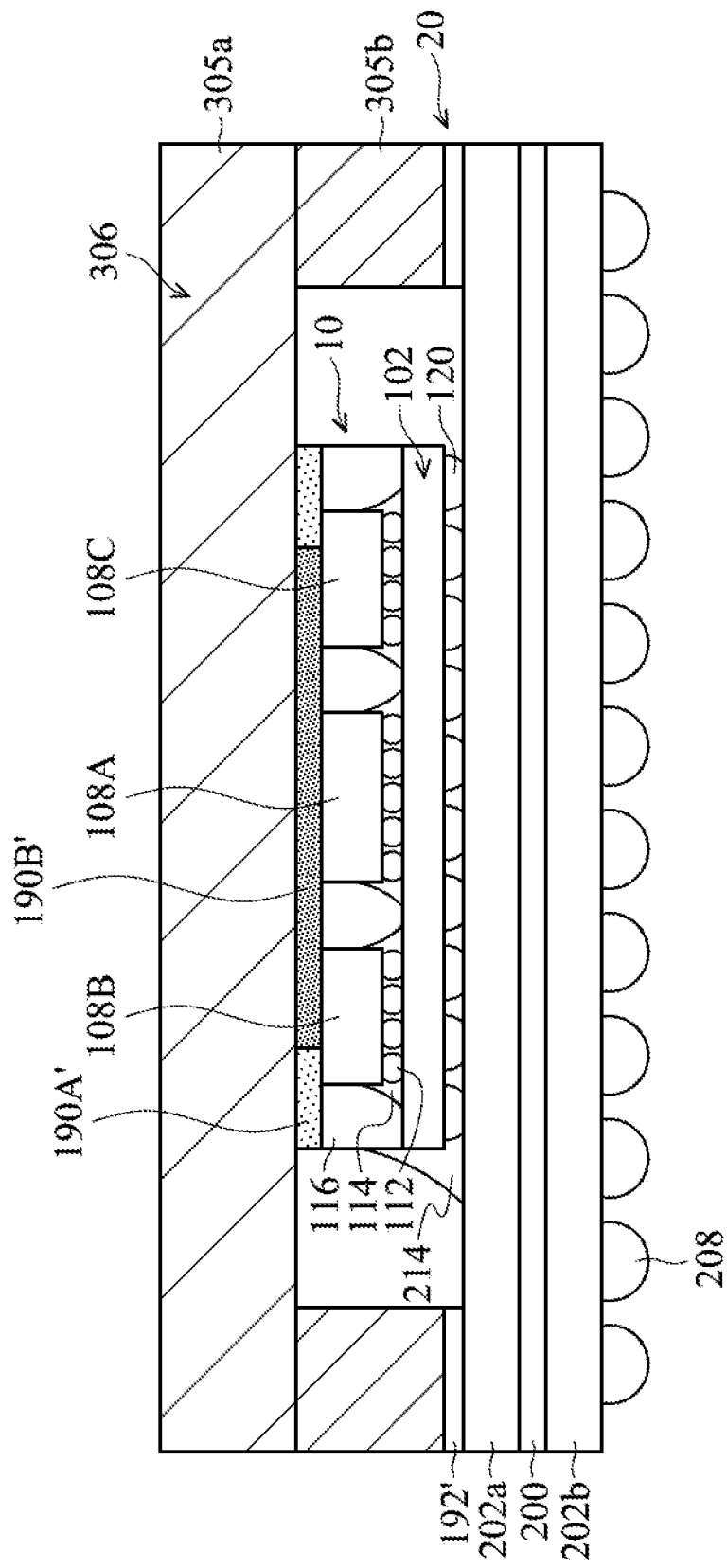

As shown in FIG. 7G, similar to the embodiments mentioned above, the protective element 306 is attached to the die package 10 and the substrate 20, in accordance with some embodiments. As a result, the first extended adhesive element 190A', the second extended adhesive element 190B' and the third extended adhesive element 192' are formed. The arrangement and/or distribution of the first extended adhesive element 190A' and the second extended adhesive element 190B' may be the same as or similar to those illustrated in FIGS. 2C, 3, 4C, and/or 5C.

Due to the hybrid adhesive elements including the first extended adhesive element 190A' and the second extended adhesive element 190B', a strong adhesion between the protective element 306 and the die package 10 and a good heat dissipation of the die package 10 may be achieved at the same time. The performance and reliability of the package structure are greatly improved.

In some embodiments, a single second adhesive element that has good thermal conductivity is formed to enhance the heat dissipation of the chip structure(s). However, embodiments of the disclosure are not limited thereto. Many variations and/or modifications can be made to embodiments of the disclosure. In some other embodiments, two or more second adhesive elements that have good thermal conductivity are formed.

Figure 8:
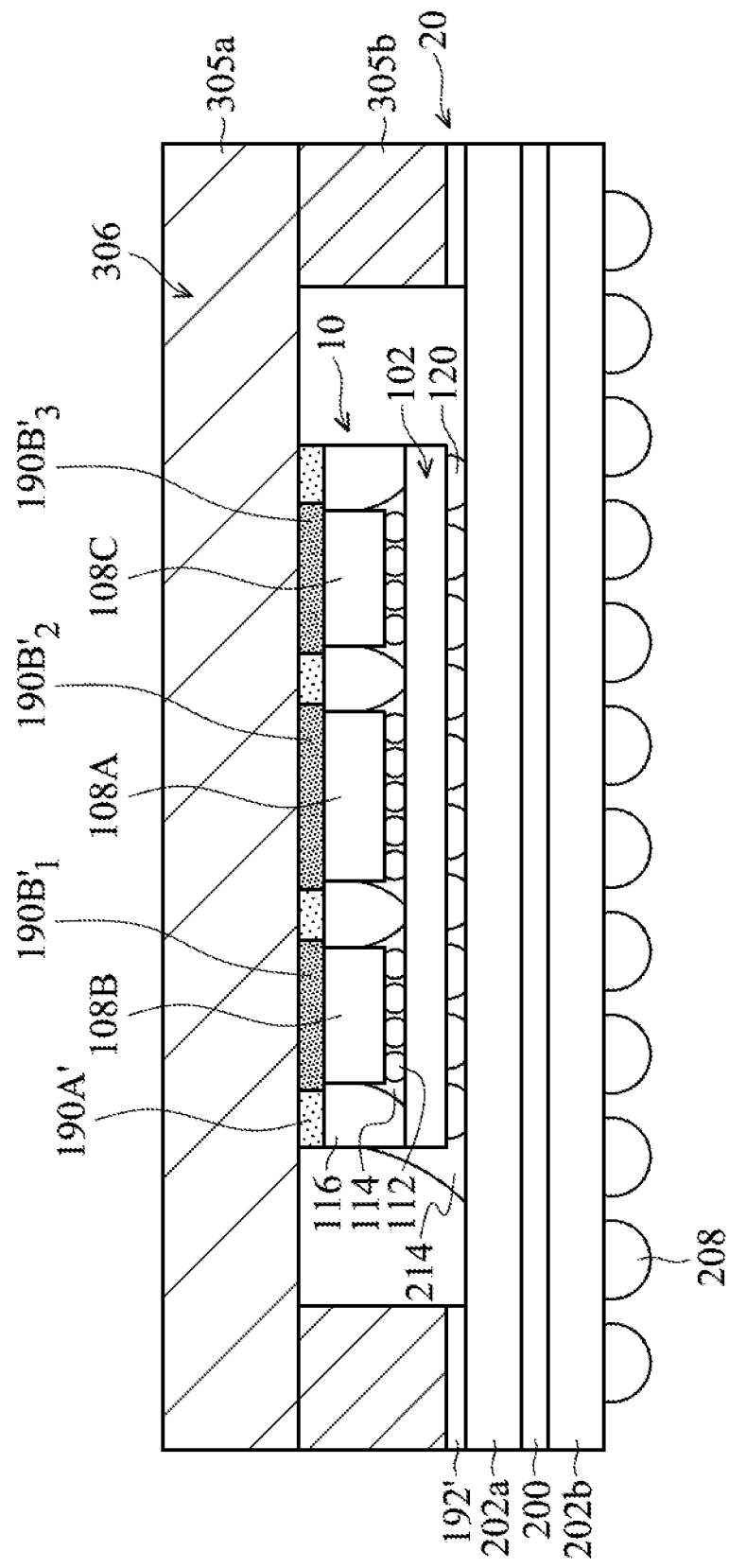
FIG. 8 is a cross-sectional view of a portion of a package structure, in accordance with some embodiments.
Figure 9:
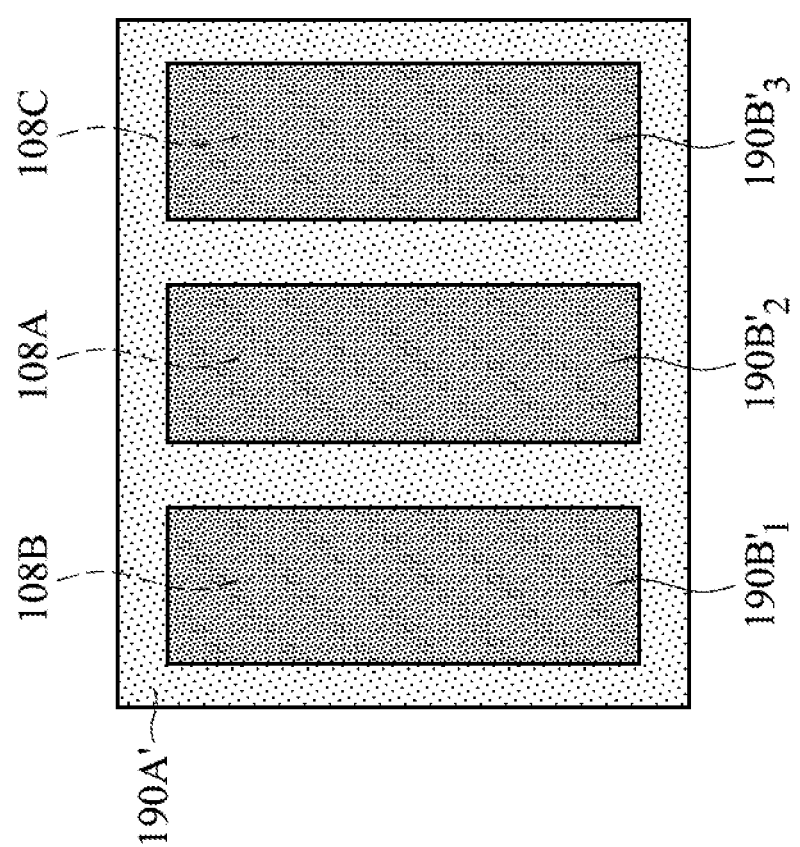
FIG. 9 is a plan view of a portion of a package structure, in accordance with some embodiments.

FIG. 8 is a cross-sectional view of a portion of a package structure, in accordance with some embodiments. FIG. 9 is a plan view of a portion of a package structure, in accordance with some embodiments. In some embodiments, FIG. 9 shows the top view of a portion of the structure shown in FIG. 1C. In some embodiments, FIG. 9 shows the distribution of the adhesive elements over the chip structures.

Similar to the embodiments illustrated in FIG. 7G, in some embodiments, the die package 10 includes multiple chip structures 108A, 108B, and 108C. In some embodiments, multiple second extended adhesive elements $190B'_1$, $190B'_2$, and $190B'_3$ are formed to respectively cover the hot zone areas of the chip structures 108B, 108A, and 108C, as shown in FIGS. 8 and 9. In some embodiments, each of the second extended adhesive elements $190B'_1$, $190B'_2$, and $190B'_3$ is laterally surrounded by the first extended adhesive element 190A', as shown in FIG. 9.

Due to the hybrid adhesive elements including the first extended adhesive element 190A' and the second extended adhesive elements $190B'_1$ to $190B'_3$, a strong adhesion between the protective element 306 and the die package 10 and a good heat dissipation of the die package 10 may be achieved at the same time. The performance and reliability of the package structure are greatly improved.

Figure 10A:
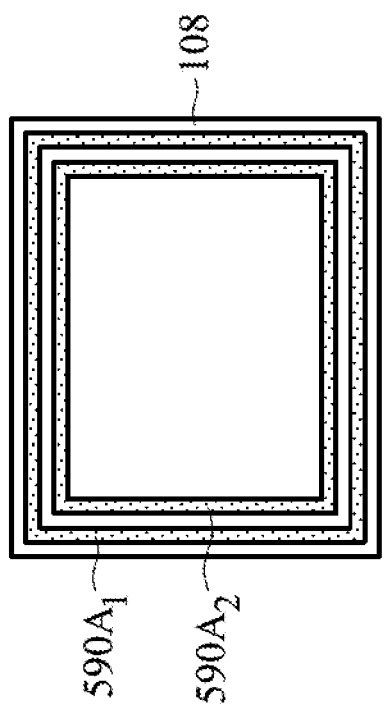
FIGS. 10A-10C are plan views of various stages of a process for forming a portion of a package structure, in accordance with some embodiments.
Figure 10C:
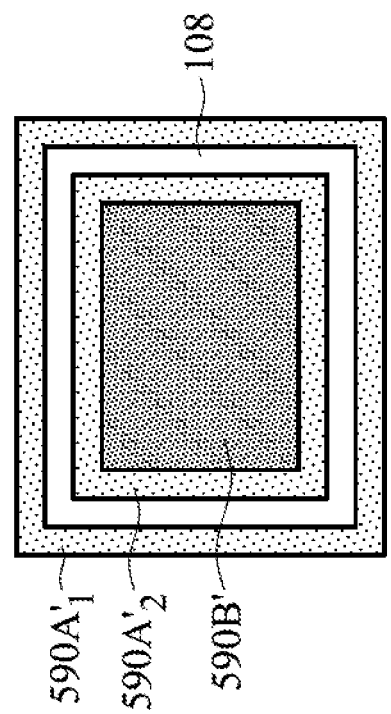
Figure 10B:
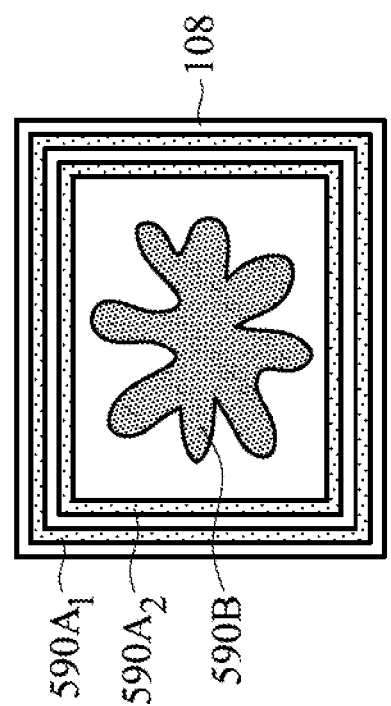

Many variations and/or modifications can be made to embodiments of the disclosure. FIGS. 10A-10C are plan views of various stages of a process for forming a portion of a package structure, in accordance with some embodiments. As shown in FIG. 10A, multiple first adhesive elements $590A_1$ and $590A_2$ are formed, in accordance with some embodiments. In some embodiments, the first adhesive elements $590A_1$ and $590A_2$ are adhesive glues that are dispended or applied on the chip structure 108. In some embodiments, the first adhesive element 590A$_1$ laterally surrounded the first adhesive element 590A$_2$.

As shown in FIG. 10B, similar to the embodiments illustrated in FIG. 2B, a second adhesive element 590B is formed over the chip structure 108, in accordance with some embodiments. The second adhesive element 590B is laterally surrounded by the first adhesive elements 590A$_1$ and 590A$_2$.

Afterwards, similar to the embodiments illustrated in FIGS. 2C and 1D, the first adhesive elements 590A$_1$ and 590A$_2$ and the second adhesive element 590B are squeezed by the protective element 306. As a result, the first adhesive elements 590A$_1$ and 590A$_2$ and the second adhesive element 590B are extended to respectively form first extended adhesive elements 590A'$_1$ and 590A'$_2$ and second extended adhesive element 590B', as shown in FIG. 10C in accordance with some embodiments.

In some embodiments, the first extended adhesive elements 590A'$_1$ and 590A'$_2$ and the second extended adhesive element 590B' become thinner and occupy larger area of the chip structure 108 than the first adhesive elements 590A$_1$ and 590A$_2$ and the second adhesive element 590B. In some embodiments, the first extended adhesive element 590A'$_2$ and second extended adhesive element 590B' are in direct contact with each other. In some embodiments, the first extended adhesive element 590A'$_1$ and second extended adhesive element 590B' are not in direct contact with each other, as shown in FIG. 10C.

In some embodiments, a portion of the chip structure 108 is not covered by the first extended adhesive elements 590A'$_1$ and 590A'$_2$ and the second extended adhesive element 590B'. In some embodiments, the uncovered portion of the chip structure 108 laterally surrounds the first extended adhesive elements 590A'$_2$ and the second extended adhesive element 590B'.

Figure 11A:
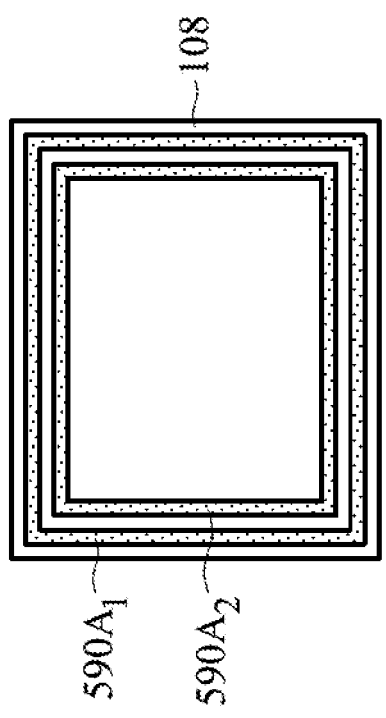
FIGS. 11A-11C are plan views of various stages of a process for forming a portion of a package structure, in accordance with some embodiments.
Figure 11C:
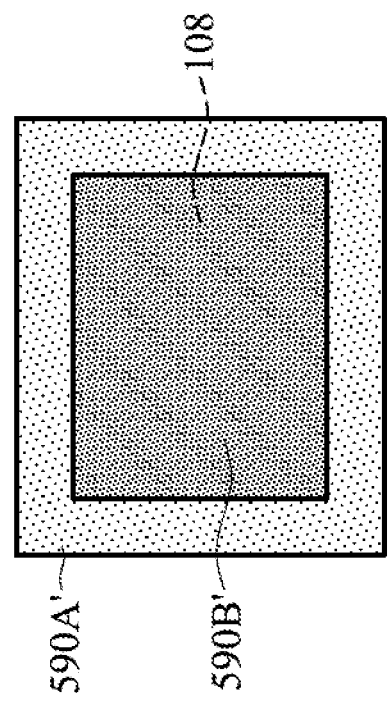
Figure 11B:
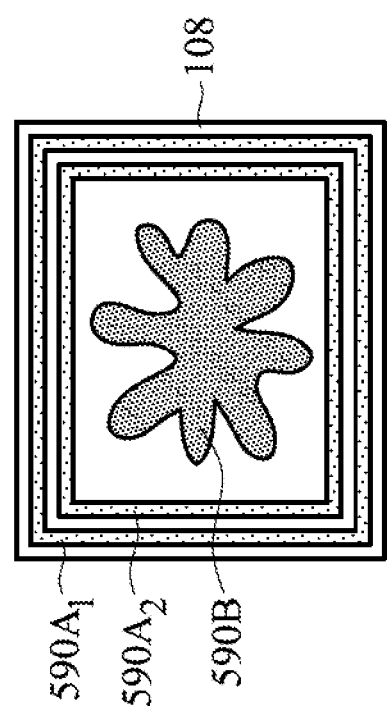

Many variations and/or modifications can be made to embodiments of the disclosure. FIGS. 11A-11C are plan views of various stages of a process for forming a portion of a package structure, in accordance with some embodiments. As shown in FIGS. 11A-11B, the processes the same as or similar to those shown in FIGS. 10A-10B are performed. As a result, the structure shown in FIG. 11B is formed.

Afterwards, similar to the embodiments illustrated in FIGS. 2C and 1D, the first adhesive elements 590A$_1$ and 590A$_2$ and the second adhesive element 590B are squeezed by the protective element 306. As a result, the first adhesive elements 590A$_1$ and 590A$_2$ are extended to link together and form first extended adhesive element 590A', as shown in FIG. 11C in accordance with some embodiments. In some embodiments, the second adhesive element 590B is extended to form second extended adhesive element 590B', as shown in FIG. 11C in accordance with some embodiments.

Embodiments of the disclosure form a package structure with a protective element used for warpage-control and/or heat dissipation. Two or more adhesive elements are used to bond the protective element to chip structure(s) or a die package including one or more chip structures. One of the adhesive elements is thermally conductive and is capable of leading out heat efficiently. Another adhesive element may help to reduce the risk of cracking of the package structure or delamination of the protective element. Due to the hybrid adhesive elements, a strong adhesion between the protective element and the chip structure(s) and a good heat dissipation of the chip structure(s) may be achieved at the same time. The performance and reliability of the package structure are greatly improved.

In accordance with some embodiments, a method for forming a package structure is provided. The method includes disposing a chip structure over a substrate and forming a first adhesive element directly on the chip structure. The first adhesive element has a first thermal conductivity. The method also includes forming a second adhesive element directly on the chip structure. The second adhesive element has a second thermal conductivity, and the second thermal conductivity is greater than the first thermal conductivity. The method further includes attaching a protective lid to the chip structure through the first adhesive element and the second adhesive element. The protective lid extends across opposite sidewalls of the chip structure.

In accordance with some embodiments, a package structure is provided. The package structure includes a substrate and a chip structure over the substrate. The package structure also includes a protective lid attached to the chip structure through a first adhesive element and a second adhesive element. The first adhesive element has a first thermal conductivity, and the second adhesive element has a second thermal conductivity. The second thermal conductivity is greater than the first thermal conductivity. The protective lid extends across opposite sidewalls of the chip structure. The first adhesive element and the second adhesive element are in direct contact with the chip structure.

In accordance with some embodiments, a package structure is provided. The package structure includes a substrate and a chip structure over the substrate. The package structure also includes a heat dissipation element attached to the chip structure through a first adhesive element and a second adhesive element. The first adhesive element contains first fillers, and the second adhesive element contains second fillers. The first fillers and the second fillers are made of different materials. The first adhesive element and the second adhesive element are in direct contact with the chip structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a package structure, comprising:
disposing a chip-containing structure over a substrate;
forming a first adhesive element directly above the chip-containing structure, wherein the first adhesive element has a first thermal conductivity;
forming a plurality of second adhesive elements directly above the chip-containing structure, wherein the second adhesive elements are spaced apart from each other, each of the second adhesive elements has a second thermal conductivity, and the second thermal conductivity is greater than the first thermal conductivity; and
attaching a protective lid to the chip-containing structure through the first adhesive element and the second adhesive elements, wherein the protective lid extends across opposite sidewalls of the chip-containing structure.

2. The method for forming a package structure as claimed in claim 1, wherein one of the second adhesive elements is formed to be closer to a center of a top surface of the chip-containing structure than the first adhesive element.

3. The method for forming a package structure as claimed in claim 1, wherein the first adhesive element is a first adhesive glue, each of the second adhesive elements is a second adhesive glue, and the first adhesive glue and the second adhesive glue are spread over the chip-containing structure while the protective lid is attached to the chip-containing structure.

4. The method for forming a package structure as claimed in claim 1, wherein the first adhesive element is an adhesive glue, and each of the second adhesive elements is an adhesive tape.

5. The method for forming a package structure as claimed in claim 1, wherein the first adhesive element is a first adhesive tape, and the second adhesive elements are second adhesive tapes.

6. The method for forming a package structure as claimed in claim 1, wherein the first adhesive element and the second adhesive elements are formed to be separated from each other before the protective lid is attached to the chip-containing structure, and the first adhesive element and the second adhesive elements are extended to be in direct contact with each other after the protective lid is attached to the chip-containing structure.

7. The method for forming a package structure as claimed in claim 1, wherein the first adhesive element is formed to cover at least one corner portion of the chip-containing structure, and one of the second adhesive elements is formed to cover a center of the chip-containing structure.

8. The method for forming a package structure as claimed in claim 1, wherein the first adhesive element has a first concentration of fillers, each of the second adhesive elements has a second concentration of fillers, and the second concentration is higher than the first concentration.

9. The method for forming a package structure as claimed in claim 1, wherein the first adhesive element contains first fillers with a first average size, each of the second adhesive elements contains second fillers with a second average size, and the second average size is greater than the first average size.

10. The method for forming a package structure as claimed in claim 1, wherein the first adhesive element laterally surrounds each of the second adhesive elements.

11. A method for forming a package structure, comprising:
forming a first adhesive element directly above a chip structure, wherein the first adhesive element has a first portion and a second portion, the first portion is spaced apart from the second portion, and the first adhesive element has a first thermal conductivity;
forming a second adhesive element directly above the chip structure, wherein the second adhesive element has a second thermal conductivity, and the second thermal conductivity is greater than the first thermal conductivity; and
attaching a protective lid to the chip structure through the first adhesive element and the second adhesive element, wherein the protective lid is wider than the chip structure.

12. The method for forming a package structure as claimed in claim 11, wherein the first adhesive element and the second adhesive element are formed to be separated from each other before the protective lid is attached to the chip structure, and the first adhesive element and the second adhesive element are extended to be in direct contact with each other after the protective lid is attached to the chip structure.

13. The method for forming a package structure as claimed in claim 11, wherein the first adhesive element has a first concentration of fillers, the second adhesive element has a second concentration of fillers, and the second concentration is higher than the first concentration.

14. The method for forming a package structure as claimed in claim 11, wherein the first adhesive element contains first fillers with a first average size, the second adhesive element contains second fillers with a second average size, and the second average size is greater than the first average size.

15. The method for forming a package structure as claimed in claim 11, wherein the chip structure has an uncovered portion laterally surrounding the first portion of the first adhesive element and the second adhesive element, the second portion of the first adhesive element laterally surrounds the uncovered portion, and the uncovered portion is free of the first adhesive element and the second adhesive element.

16. A method for forming a package structure, comprising:
bonding a plurality of chip structures to a redistribution structure;
forming a protective layer surrounding the chip structures;
bonding the redistribution structure to a substrate;
forming a first adhesive element directly above the protective layer, wherein the first adhesive element has a first thermal conductivity;
forming a second adhesive element, wherein the second adhesive element has a first portion and a second portion, the first portion is directly above a first chip structure of the chip structures, the second portion is directly above a second chip structure of the chip structures, the first portion is spaced apart from the second portion, wherein the second adhesive element has a second thermal conductivity, and the second thermal conductivity is higher than the first thermal conductivity; and
attaching a protective lid to the chip structures through the first adhesive element and the second adhesive element.

17. The method for forming a package structure as claimed in claim 16, wherein each of the first adhesive element and the second adhesive element becomes thinner and wider after the protective lid is attached to the chip structures.

18. The method for forming a package structure as claimed in claim 16, wherein the first adhesive element and the second adhesive element extend to be in direct contact with each other after the protective lid is attached to the chip structures.

19. The method for forming a package structure as claimed in claim 16, wherein the protective lid is wider than each of the first adhesive element and the second adhesive element.

20. The method for forming a package structure as claimed in claim 16, wherein a portion of the first adhesive element is between the first portion of the second adhesive element and the second portion of the second adhesive element.

* * * * *